United States Patent [19]

Avins et al.

[11] 4,379,221

[45] Apr. 5, 1983

[54] CIRCUIT FOR DETECTING PHASE RELATIONSHIP BETWEEN TWO SIGNALS

[75] Inventors: Jeremiah Y. Avins, Kendall Park; Donald W. Phillion, Princeton, both of N.J.

[73] Assignee: RCA Corporation, New York, N.Y.

[21] Appl. No.: 167,488

[22] Filed: Jul. 11, 1980

[51] Int. Cl.³ .............. H03D 13/00; G06M 3/14; G01R 25/00
[52] U.S. Cl. .............. 377/43; 250/231 SE; 328/133; 340/347 P; 377/53
[58] Field of Search ......... 235/92 PS, 92 EV, 92 DP; 328/133; 250/231 SE; 340/347 P

[56] References Cited

U.S. PATENT DOCUMENTS

| | | | |
|---|---|---|---|
| 3,549,870 | 12/1970 | Lay | 235/92 PS |
| 3,609,326 | 9/1971 | Bagley et al. | 235/92 TF |
| 3,631,343 | 12/1971 | Schmidhauser | 324/106 |
| 3,638,001 | 1/1972 | Gordon | 324/78 D |
| 3,729,677 | 4/1973 | Band | 324/78 D |
| 4,027,146 | 5/1977 | Gilmore | 324/78 D |
| 4,073,432 | 2/1978 | Schröder | 235/92 EV |
| 4,094,371 | 6/1978 | Ferrell | 340/347 P X |
| 4,112,358 | 9/1978 | Ashida | 324/78 D |
| 4,150,432 | 4/1979 | Sorden | 324/78 D |
| 4,220,924 | 9/1980 | Osann, Jr. | 328/133 X |
| 4,246,497 | 1/1981 | Lawson et al. | 328/133 X |
| 4,300,039 | 11/1981 | Avins | 340/347 P X |
| 4,308,500 | 12/1981 | Avins | 340/347 P X |
| 4,328,463 | 5/1982 | Avins | 340/347 P X |

Primary Examiner—Felix D. Gruber
Attorney, Agent, or Firm—Joseph S. Tripoli; Donald W. Phillion

[57] ABSTRACT

A circuit for detecting leading or lagging phase relationship between first and second two-level input signals at each level transition of a selected one of the input signals and comprising first and second Exclusive OR gates each having first and second input terminals and a single output terminal and each responsive to signals of equal and non-equal logic levels supplied to the first and second input terminals thereof to produce an output signal having high and low logic levels, respectively. Further connections supply the first and second input signals to the first input terminal of the first and second Exclusive OR gates, respectively. Also provided is a decoder responsive to the output signals of the first and second Exclusive OR gates to determine the phase relationship of the first and second signals at each level transition of the selected input signal and for generating and supplying to the input terminals of the first and second Exclusive OR gates, after each determination of phase relationship, an acknowledgment signal which prepares the circuit for the reception of the next transition of the selected input signal.

6 Claims, 4 Drawing Figures

CIRCUIT FOR DETECTING PHASE RELATIONSHIP BETWEEN TWO SIGNALS

This invention relates generally to incremental encoders of the type employed to track the position of a moving object such as a bi-directionally rotatable disc and more particularly to a circuit for determining the phase relationship of a pair of two-level input signals of equal frequency produced by said moving object upon the occurrence of each level transition of one of said input signals.

Prior art systems have been devised which detect the leading or lagging phase relationship of the two input signals at the time of each level transition of one of the two signals. These prior art devices accomplish their result, in effect, by dividing the two signals into four quadrants for each complete cycle of operation. More specifically, the logic levels of the two signals will have four relationships, e.g. when they are both high, when they are both low, and when one is high and the other is low. Such prior art devices further contain logic which remembers at least the two immediately prior permutations of logic levels in addition to the one in which a determination of the phase relationship of the two signals at a level transition is to be made. Prior art devices of this type are complex and require a relatively large amount of logic in order to remember the two prior level states as well as the state in which the decision is to be made, and then to decide from such information the proper interpretation of the level transition in the state being considered. Such complex logic is expensive and therefore prohibitive in many applications. Further, because of the complexity, the time duration required for the circuit to make a decision is greater than would be required for a system having fewer components, and therefore functions more slowly to further limit the number of feasible applications.

A recent development in the incremental encoder art is described in co-pending application Ser. No. 103,443, filed Dec. 14, 1979, now U.S. Pat. No. 4,308,500 by Jeremiah Yehudi Avins and entitled "Incremental Encoder." In this co-pending application the structure includes at least two Exclusive OR gates, two flip-flop circuits, and an up/down counter means or equivalent thereof, all of which cooperate to determine the correct direction or phase relationship-indicating signal at each transition of at least one of two two-level input signals so that each transition thereof will be recorded as occurring either during a leading or a lagging phase relationship of the two input signals.

A primary objective of the present invention is to provide an improved and simplified incremental encoder which does not require any flip-flop circuits and which is capable of detecting all transitions of one of the two received two-level input signals.

In accordance with a preferred form of the invention there is provided first and Exclusive OR gates each having first and second input terminal means and a single output terminal means and each responsive to signals of equal and non-equal levels supplied to the first and second input terminal means thereof to produce an output signal having high and low logic levels, respectively, and means for supplying first and second received input signals to the first input terminal means of said first and second Exclusive OR gates, respectively. Also provided are decoding means responsive to the output signals of said first and second Exclusive OR gates to determine the phase relationship of said first and second input signals at each level transition of one of said input signals, and means for generating and supplying to said second input terminal means of said first and second Exclusive OR gates, after each determination of phase relationship, a signal whose level is the same as the level of said one input signal.

Figure 1:
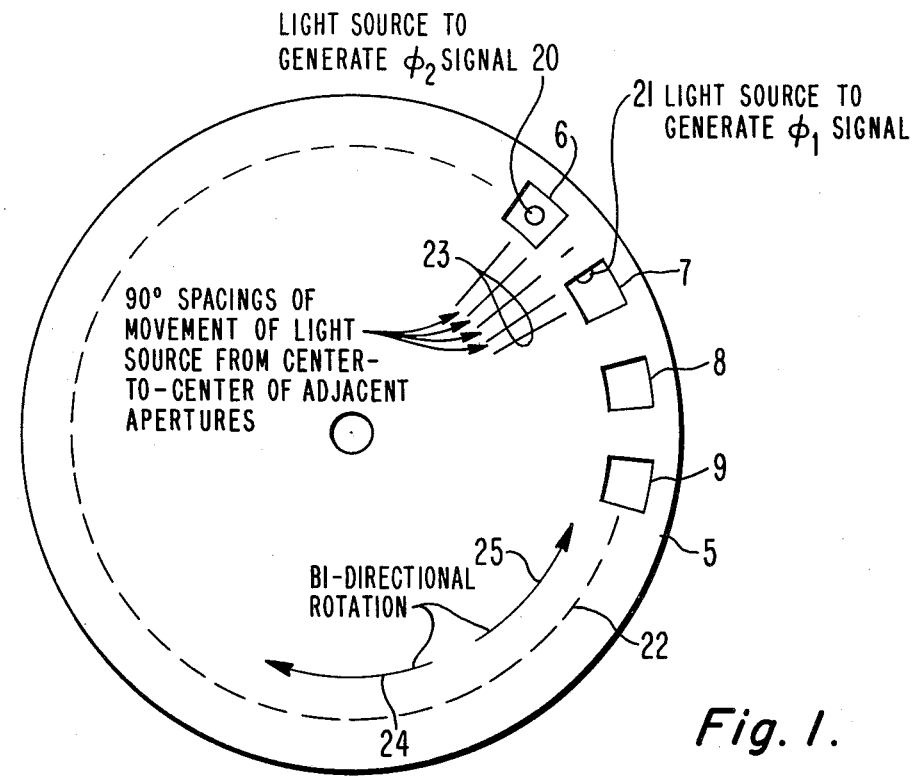
FIG. 1 shows a prior art rotatable disc with apertures positioned around the perimeter thereof for generating first and second direction indicating two-level signals with leading or lagging phase relationship.

Referring now to FIG. 1 there is shown a prior art means for generating a pair of two-level signals which have either a leading or lagging phase relationship. The disc 5 has a circular row of apertures 22 formed around the perimeter thereof, such as the individual apertures 6, 7, 8, and 9. A pair of light sources 20 and 21 are positioned adjacent the apertures to project a beam of light through said apertures to photo-electric devices (not shown) as the disc 5 is rotated. The two light sources 20 and 21 are positioned in such a manner that one of the light sources 20 will be centered in an aperture, such as aperture 6, at the time the other light source 21 is just crossing the edge of another aperture 7 and into said aperture 7. Thus, if the disc 5 is rotating in the counterclockwise direction, as indicated by arrow 25, the signal $\phi_2$ produced by light source 20 will lead the phase of the signal $\phi_1$ produced by light source 21 to produce the signals $\phi_1$ and $\phi_2$ shown in waveforms A and D of FIG. 3.

Figure 3:
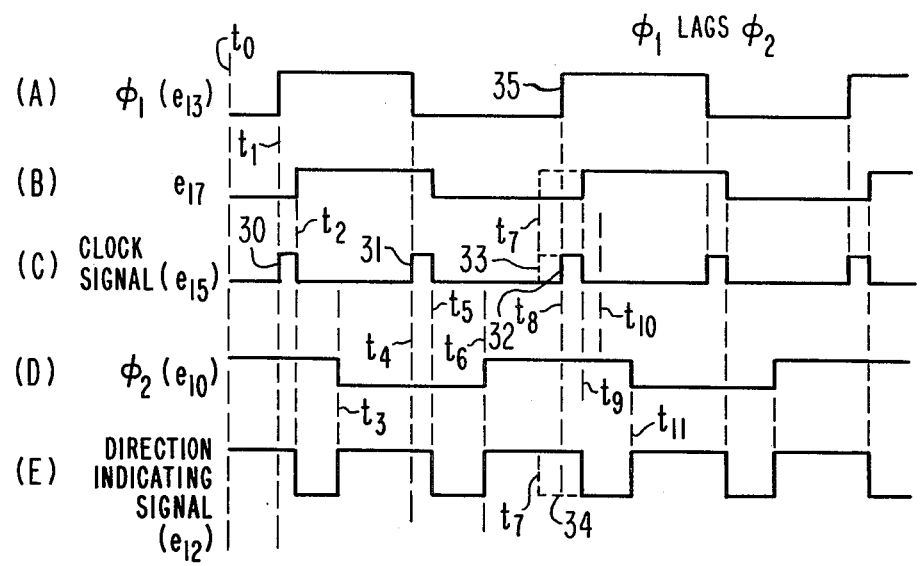
FIG. 3 is a first set of waveforms showing the voltage of various points in the diagram of FIG. 2 during the operation thereof when the two input signals have a first phase relationship.

Specifically, signal $\phi_1$, shown as waveform A of FIG. 3, is generated by the interruption of light source 21 of FIG. 1 by disc 5, and signal $\phi_2$, shown as waveform B of FIG. 3, is generated by the interruption of light source 20 of FIG. 1 by disc 5. It is to be noted that while signals $\phi_1$ and $\phi_2$ are shown as being in phase quadrature it is not necessary that they be so. It is only necessary that there be a leading or lagging phase relationship.

Figure 4:
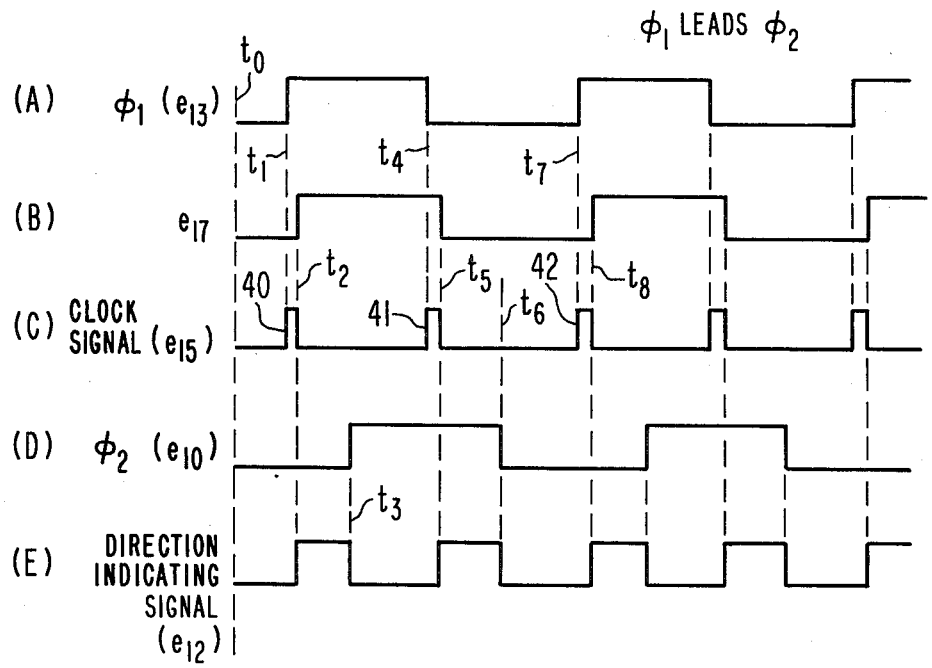
FIG. 4 is another set of waveforms showing the voltage at various points in the diagram of FIG. 2 during the operation thereof when the two input signals have a second phase relationship.

When the rotation of disc 5 is reversed to rotate in the direction of arrow 24 (clockwise), the phase of signal $\phi_1$ produced by light source 21 will lead the phase of the signal $\phi_2$ produced by light source 20, as shown in waveforms A and D of FIG. 4.

Figure 2:
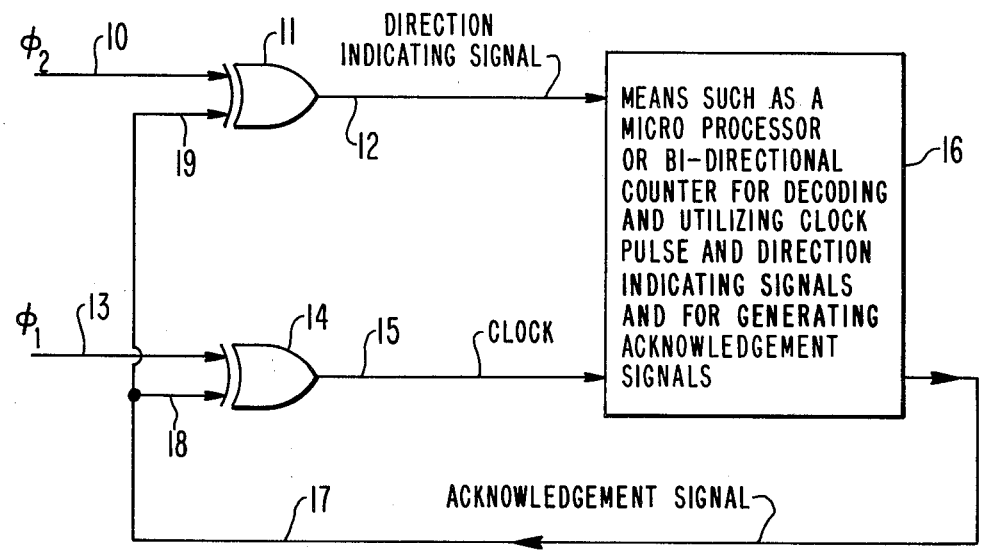
FIG. 2 is a combined function and logic diagram of a preferred form of the invention.

Referring now to FIG. 2, the two input signals $\phi_1$ and $\phi_2$ are supplied respectively to first input leads 13 and 10 of Exclusive OR gates 14 and 11, the outputs of which are then supplied respectively to the clock input terminal 15 of utilization means 16 and the direction (phase relation) indicating signal input terminal 12 of utilization means 16. The signals $\phi_1$ and $\phi_2$ are outputs from photo-electric devices (not shown). Utilization (decoding) means 16 is essentially a logic means which receives and records the clock pulses from Exclusive OR gate 14 in accordance with the direction (phase relation) indicating signal supplied from Exclusive OR gate 11. Utilization means 16 can be, for example, a bi-directional counter, a microprocessor, or other suitable logic means required by a particular application.

After reception of a clock signal from Exclusive OR gate 14, utilization means 16 generates an acknowledgment signal on lead 17 acknowledging the receipt and the correct decoding of such clock signal in accordance with the level of the concurrent direction indicating signal appearing on input terminal 12. Such acknowledgment signal is supplied back to the second input terminals 18 and 19 of Exclusive OR gates 14 and 11 via lead 17.

Before discussing the operation of the circuit of FIG. 2, it should be noted that the waveforms of FIG. 3 will be identified herein by defining them as waveforms 3A, 3B, 3C, 3D, and 3E and the waveforms of FIG. 4 as waveforms 4A, 4B, 4C, 4D, and 4E. Further, the voltage represented by each waveform of FIGS. 3 and 4 will be identified by the letter "e" with the subscript corresponding to the lead in FIG. 2 having the corresponding reference character. Thus, for example, the input signal $\phi_1$ on lead 13 will also be identified herein as $e_{13}$, the acknowledgment signal on lead 17 as $e_{17}$, the clock signal on lead 15 as $e_{15}$, $\phi_2$ as $e_{10}$, and the direction indicating signal appearing on lead 12 as $e_{12}$.

In the operation of the circuit, assume that the initial operating conditions are as shown at time $t_0$ in FIG. 3, wherein $\phi_1$ and $e_{17}$ are at their low levels, and $\phi_2$ and the direction indicating signal $e_{12}$ are at their high levels. There is no clock signal present at time $t_0$.

The direction indicating signal $e_{12}$ is at its high level since the voltage levels appearing on the two input terminals of Exclusive OR gate 11 are unequal. It is a characteristic of an Exclusive OR gate that when the two signals supplied to the two input terminals thereof are equal, the output is at a low level and when the two input signals supplied thereto are unequal the output of the Exclusive OR gate is at a high level. Accordingly, at time $t_0$ the output of Exclusive OR gate 14 is at a low level since both $\phi_1$ and the acknowledgment signal $e_{17}$ are at low levels as shown in waveforms 3A and 3B.

At time $t_1$, $\phi_1$ changes from its low to its high level, as shown in waveform 3A, to cause the two input signals to Exclusive OR gate 14 to be unequal so that the output $e_{15}$ thereof on lead 15 rises to a high level, as shown in waveform 3C. The transition of the output signal of Exclusive OR gate 14 from its low to its high level constitutes a clock signal 30 which is received by the logic within block 16 and which indicates the change of level of $\phi_1$ when the phase relationship of $\phi_1$ and $\phi_2$ is as indicated by the polarity of the direction indicating signal $e_{12}$. Referring to the disc structure 5 of FIG. 1 as an example, a positive direction indicating signal indicates the condition of $\phi_1$ lagging $\phi_2$, which condition is produced by a counter-clockwise rotation of the disc. A clockwise rotation of disc 5 will be indicated by a negative direction indicating signal. The reason why a positive or negative direction indicating signal indicates counterclockwise or clockwise rotation of the disc will become more apparent from the following discussion.

Clock signals supplied to decoding means 16 which, as mentioned before, can be a bi-directional counter for example, will cause such counter to either increment or to decrement by one in accordance with the polarity of the direction indicating signal $e_{12}$ on lead 12, thereby indicating the direction of rotation of the disc 5 in FIG. 1 and also the angular amount of rotation which is determined by the spacing between the apertures on the perimeter of the disc. The counter is arbitrarily constructed to decrement by one during each transition of $\phi_1$ when the disc is rotating in a counter-clockwise direction.

Decoding means 16 is constructed to generate an acknowledgment signal which, when the decoding means 16 is a bi-directional counter, can be the two-level output of the least significant bit of said counter. Assume that the least significant bit position of such counter contained a binary 0 at the time $t_0$ and subsequently changed to a binary 1, at time $t_2$, as a result of the clock pulse 30 occurring at time $t_1$. Thus at time $t_0$ the signals supplied to the two inputs of Exclusive OR gate 11 are unequal ($\phi_2$ is at its high level and $e_{17}$ is at its low level) so that the direction indicating signal $e_{12}$ is at its high level.

However, the changing of the contents of the least significant bit position of the counter in logic means 16 results in a high level acknowledgment signal being supplied back via lead 17 to the inputs of Exclusive OR gates 11 and 14 at time $t_2$. Such high level signal will produce two results. First, the output $e_{15}$ of Exclusive OR gate 14 will return to its low level since the signal levels supplied to its two inputs are now equal. Such signal levels were unequal between times $t_1$ and $t_2$. Second, the direction indicating signal $e_{12}$ (FIG. 3E) appearing on the output 12 of Exclusive OR gate 11 will change from its high to its low level at time $t_2$ since the positive acknowledgment signal on lead 17 will be the same level as $\phi_2$ at time $t_2$.

The low level condition of the direction indicating signal of waveform 3E occurring at time $t_2$ is incorrect if the disc 5 of FIG. 1 continues its counterclockwise rotation. As defined above a high direction indicating signal is required. However, at time $t_3$ in waveform 3D, $\phi_2$ changes from its high to its low level thereby causing the two input signal levels supplied to Exclusive OR gate 11 to be unequal so that the output of Exclusive OR gate 11 changes from its low to its high level.

Thus, at time $t_4$ when $\phi_1$ again changes from its high to its low level the direction indicating signal $e_{12}$ on lead 12, shown in waveform 3E, will be of the proper high level to indicate the counter-clockwise direction of rotation of disc 5 of FIG. 1. Worded differently, the high level of the direction indicating signal $e_{12}$ of waveform 3E indicates that the phase of $\phi_1$ is lagging the phase of $\phi_2$ at the transition of $\phi_1$ from its high to its low level at time $t_4$.

The transition of $\phi_1$ from its high to its low level at time $t_4$ also generates another clock pulse 31 (waveform 3C) at the output terminal 15 of Exclusive OR gate 14. Such clock pulse 31 is supplied to decoding logic 16 which in turn generates another acknowledgment signal on lead 17 (i.e. changes the level of the acknowledgment signal $e_{17}$ from its high to its low level at time $t_5$). The now low level acknowledgment signal is supplied back to the input terminals of Exclusive OR gates 11 and 14 to effect two results. The first result is that the clock pulse on the output of Exclusive OR gate 14 is terminated since the signal levels supplied to the two inputs of Exclusive OR gate 14 now become equal and the output of Exclusive OR gate 14 changes back to its low level, as shown at time $t_5$ in waveform 3C. The second result of the low level acknowledgment signal 31 is that the signal level supplied to the two inputs of Exclusive OR gate 11 also become equal so that the direction indicating output signal thereof changes from its high to its low level, as shown in waveform 3E.

Next, at time $t_6$, $\phi_2$ changes from its low to its high level to change the level of the direction indicating signal $e_{12}$ at the output of Exclusive OR gate 11 from its low to its high level in preparation for the next phase transition of $\phi_1$ at time $t_8$. At time $t_8$, $\phi_1$ changes from its low to its high level to generate a third clock pulse 32 at the output of Exclusive OR gate 14 which is supplied to decoding means 16 in the manner described hereinbefore. Decoding means 16 subsequently generates a high level acknowledgment signal at time $t_9$ which is supplied back to inputs 19 and 18 of Exclusive OR gates 11 and 14 via lead 17 to terminate the clock pulse 32 at time $t_9$ and also to change the level of the direction indicating signal at the output of Exclusive Or gate 11 from its high to its low level, as shown in waveform 3E, also at time $t_9$.

The description of a complete cycle of operation extending from a first low-to-high level transition $\phi_1$ at time $t_1$ to a second low-to-high level transition of $\phi_1$ at time $t_8$ has now been completed.

It is to be understood that the width of the clock pulses 30, 31 and 32 in relation to the width of the other waveforms $\phi_1$ and $\phi_2$ are shown disproportionately large. More specifically the clock pulses 30, 31, and 32 can have a width of less than a microsecond, whereas the periods of input signals $\phi_1$ and $\phi_2$ can be of the order of hundreds of microseconds or even milliseconds, depending upon the speed of the disc of FIG. 1, or the speed of the other devices employed with the invention. For example, when employed with means for measuring the direction of the rings produced by an interferometer the periods of $\phi_1$ and $\phi_2$ will be much shorter than when measuring the rotation of a disc such as shown in FIG. 1.

After the phase transition of $\phi_1$ at time $t_8$, and the resulting acknowledgment pulse 32 occurring at time $t_9$, it is possible that the disc 5 of FIG. 1 will stop at time $t_{10}$ and then oscillate back and forth across the phase transition of $\phi_1$ at time $t_8$.

A clockwise motion of the disc of FIG. 1 (i.e. $\phi_1$ leading $\phi_2$) requires that the counter 16 increment one count indicating the clockwise rotation of the disc 5. The foregoing is effected in the following manner. As the disc rotates in a clockwise direction, it will cross $\phi_1$ at time $t_8$ before a clock pulse 33 is generated at the output of Exclusive OR gate 14 at time $t_8$. However, the level of the direction indicating signal $e_{12}$ on the output terminal 12 of Exclusive OR gate 11 is at its low level at time $t_8$ since a low level acknowledgment signal has not yet been received back from the bi-directional counter 16. Such low level acknowledgment signal is received at time $t_7$, as shown in waveform 3B, to cause the clock pulse 33 to terminate at the output of Exclusive OR gate 14 and also to change the direction indicating signal $e_{12}$ on the output of Exclusive OR gate 11 from its low to its high level, thereby preparing the system for another level transistion of $\phi_1$ at time $t_8$ should the disc rotational direction oscillate back to its original counterclockwise direction and again cross the level transition 35 of $\phi_1$.

On the other hand, should the disc continue to rotate in a clockwise direction, it will cross a high-to-low level transition of $\phi_2$ at time $t_6$ thereby causing the direction indicating signal $e_{12}$ to go to its low level at time $t_6$ in preparation for another level transistion of $\phi_1$ at time $t_4$ should the disc continue to rotate in a clockwise direction. It is to be understood that when the disc is rotating in a clockwise direction the time $t_8$ occurs after time $t_{10}$, time $t_7$ occurs after time $t_8$, time $t_6$ occurs after time $t_7$, etc.

A more detailed discussion of the operation of the structure of FIG. 2 when the phase of $\phi_1$ leads that of $\phi_2$ will now be set forth with reference to the waveforms of FIG. 4. Assume that the initial operating conditions are as shown at time $t_0$ when both $\phi_1$ and $\phi_2$ are at their low levels and the direction indicating signal $e_{12}$ is also at its low level indicating a clockwise direction of rotation of the disc 10 of FIG. 1.

At time $t_1$, $\phi_1$ changes from its low to its high level as shown in waveform 4A to generate a clock pulse 40 (waveform 3C) on the output terminal 15 of Exclusive OR gate 14. The direction indicating signal $e_{12}$ is at its low level at this time so that the clock pulse 40 is interpreted by decoding means 16 as indicating that the disc has rotated one increment in a clockwise direction.

At time $t_2$, a high level acknowledgment signal is supplied back from decoding means 16 via lead 17 to the two inputs of Exclusive OR gates 11 and 14 to effect two results. The first result is a termination of the clock signal 40 at time $t_2$ and the second result is to change the direction indicating signal from its low level to its high level since the signal levels of the two signals supplied to the two inputs of Exclusive OR gate 11 are now unequal, the acknowledgment signal $e_{17}$ going to a high level as shown in waveform 4B at time $t_2$.

Next, at time $t_4$ the signal $\phi_1$ changes from its high to its low level to generate another clock pulse 41 on the output terminal 15 of Exclusive OR gate 14.

Thus, at time $t_2$ the direction indicating signal $e_{12}$ is at its high level indicating a counterclockwise direction of rotation which is incorrect since the disc is assumed to be moving in a clockwise direction. However, at time $t_3$, $\phi_2$ changes from its low to its high level thereby causing the polarity of the directing indicating signal $e_{12}$ of waveform 4E to its low level thereby indicating that the disc is in fact rotating in a clockwise direction.

Accordingly, when the next transition of $\phi_1$ occurs at time $t_4$ a clock pulse 41 will be generated on the output terminal 15 of Exclusive OR gate 14 and will be received by decoding means 16. Since the direction indicating signal is at its low level at time $t_4$, the clock signal 41 will be interpreted as an increment of movement in the disc in a clockwise direction which is in fact the direction the disc is rotating.

Following clock pulse 41 a low level acknowledgment signal will be generated by decoding means 16 (FIG. 2) at time $t_5$ and supplied back through lead 17 to the inputs of the two Exclusive OR gates 11 and 14 to again terminate the clock pulse on lead 15 and to change the direction indicating signal $e_{12}$ on the output 12 of Exclusive OR gate 11 to its high level.

Next, at time $t_6$, the signal $\phi_2$ changes from its high level to its low level thereby changing the level of the direction indicating signal $e_{12}$ on the output terminal 12 of Exclusive OR gate 11 from its high to its low level in preparation for the next level change transition of $\phi_1$ at time $t_7$. Such low-to-high level transition of $\phi_1$ produces a clock pulse 42 on the output terminal 15 thereof which is supplied to decoding means 16. Subsequently, at time $t_8$, the usual acknowledgment signal is generated by decoding means 16 and supplied back to the Exclusive OR gates 11 and 14 to terminate the clock pulse 42 and to change the direction indicating signal $e_{12}$ of waveform 4E.

What is claimed is:

1. A circuit for determining the leading or lagging phase relationship between first and second two-level signals at each level transition of said first two-level signal, and comprising:

first and second Exclusive OR gate means each having first input terminals for receiving said first and second two level signals respectively and further having a second input terminal and an output terminal;

decoding means having first and second input terminals coupled respectively only to the output terminals of said first and second Exclusive OR gate means and responsive only to the level transitions of said first signal to detect the leading or lagging phase relationship of said first and second signals at said each level transition of said first signal, and to supply to the second input terminals of said first and second Exclusive OR gate means after each detection of said phase relationship a third signal having a level equal to the concurrent level of said first signal.

2. A circuit as in claim 1 in which said decoding means comprises:

bi-directional counting means responsive to the output signals from said first and second Exclusive OR gate means to count up or down at each level transition of said first signal in accordance with the level of said output signal from said second Exclusive OR gate means and in which the contents of the least significant bit position of said bi-directional counting means comprises said third signal.

3. A circuit as in claim 1 in which said decoding means comprises:

data processing means responsive to the output signals from said first and second Exclusive OR gate means for determining the phase relationship of said first and second signals at each level transition of said first signal and for generating said third signal.

4. A circuit for detecting leading or lagging phase relationship between first and second two level signals at each level transition of said first signal and comprising:

first and second Exclusive OR gating means each having first and second input terminal means and output terminal means and each responsive to signals of equal and non-equal levels supplied to the first and second input terminal means thereof to produce on said output terminal means an output signal having a first and second level, respectively;

first means for supplying said first and second signals to the first input terminal means of said first and second Exclusive OR gating means respectively;

decoding means having first and second input terminals coupled respectively to the output signals of said first and second Exclusive OR gating means only to determine the phase relationship of said first and second signals at each level transition of said first signal only and for generating and supplying to said second input terminal means of said first and second Exclusive OR gating means after each determination of phase relationship a third signal whose level is equal to the concurrent level of said first signal.

5. A circuit as in claim 4 in which said decoding means comprises:

data processing means responsive to the output signals from said first and second Exclusive OR gating means only for determining the phase relationship of said first and second signals at each level transition of said first signal and for generating said third signal.

6. A circuit as in claim 4 in which said decoding means comprises:

bi-directional counting means responsive to the output signal from said first and second Exclusive OR gating means to count up or down at each level transition of said first signal in accordance with the level of said output signal from said second Exclusive OR gating means and in which the contents of the least significant bit position of said bi-directional counting means comprises said third signal.

* * * * *